US012546006B2

(12) United States Patent
Winkler et al.

(10) Patent No.: US 12,546,006 B2
(45) Date of Patent: Feb. 10, 2026

(54) PRECURSOR DELIVERY SYSTEM AND METHOD THEREFOR

(71) Applicant: ASM IP Holding B.V., Almere (NL)

(72) Inventors: Jereld Lee Winkler, Gilbert, AZ (US); Eric James Shero, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 719 days.

(21) Appl. No.: 17/880,090

(22) Filed: Aug. 3, 2022

(65) Prior Publication Data

US 2023/0042784 A1 Feb. 9, 2023

Related U.S. Application Data

(60) Provisional application No. 63/230,456, filed on Aug. 6, 2021.

(51) Int. Cl.

| | |
|---|---|
| ***C23C 16/448*** | (2006.01) |
| ***C23C 16/455*** | (2006.01) |
| ***C23C 16/52*** | (2006.01) |
| ***H01L 21/67*** | (2006.01) |

(52) U.S. Cl.

CPC .......... *C23C 16/52* (2013.01); *C23C 16/4481* (2013.01); *C23C 16/455* (2013.01); *C23C 16/45557* (2013.01); *C23C 16/45561* (2013.01); *H01L 21/67017* (2013.01)

(58) Field of Classification Search

None

See application file for complete search history.

(56) References Cited

U.S. PATENT DOCUMENTS

| | | | | |
|---|---|---|---|---|
| 5,470,390 | A * | 11/1995 | Nishikawa | C23C 16/45561 118/715 |
| 6,039,809 | A * | 3/2000 | Toyama | C23C 16/45561 118/726 |
| 2004/0015300 | A1 | 1/2004 | Ganguli | |
| 2005/0217575 | A1 | 10/2005 | Gealy | |
| 2008/0044572 | A1 | 2/2008 | Loeffler | |
| 2009/0211525 | A1 | 8/2009 | Sarigiannis | |
| 2009/0266296 | A1* | 10/2009 | Tachibana | C23C 16/45544 118/715 |
| 2010/0322604 | A1 | 12/2010 | Fondurulia | |
| 2015/0176153 | A1* | 6/2015 | Chang | C23C 16/45561 137/487 |
| 2017/0342562 | A1* | 11/2017 | Lind | C23C 16/45561 |
| 2018/0251898 | A1* | 9/2018 | Yamaguchi | C23C 16/45561 |
| 2019/0177840 | A1* | 6/2019 | Eldridge | C23C 16/45561 |

* cited by examiner

*Primary Examiner* — Binu Thomas

(74) *Attorney, Agent, or Firm* — Snell & Wilmer L.L.P.

(57) ABSTRACT

A semiconductor processing system for delivering large capacity vaporized precursor from solid or liquid precursor source is disclosed. The system utilizes a carrier gas to feed the vaporized precursor to a remotely located process zone where multiple process modules are disposed. The system comprises a first and second buffer volumes configured to reduce pressure drop and increase delivery rates. A method for delivering a large capacity vaporized precursor to the remotely located process zone are also disclosed.

19 Claims, 4 Drawing Sheets

PRECURSOR DELIVERY SYSTEM AND METHOD THEREFOR

CROSS-REFERENCE TO RELATED APPLICATIONS

This application is a non-provisional of, and claims priority to and the benefit of, U.S. Provisional Patent Application No. 63/230,456, filed Aug. 6, 2021 and entitled "PRECURSOR DELIVERY SYSTEM AND METHOD THEREFOR," which is hereby incorporated by reference herein.

FIELD

The field is generally related to a precursor delivery system and method therefor, including, e.g., a large capacity vaporized precursor delivery system which utilizes a carrier gas to feed the vaporized precursor to a remotely located process zone. The field is also related to a method for delivering a large capacity vaporized precursor to a remotely located process zone.

BACKGROUND

During semiconductor processing, various vaporized precursor(s) are fed into a reaction chamber. In some applications, suitable source chemicals that are in solid or liquid phase at ambient pressure and temperature are provided in a source vessel. These solid or liquid source substances may be heated to sublimation or evaporation to produce a vaporized precursor for a reaction process, such as vapor deposition. Chemical Vapor Deposition (CVD) may call for the supply of continuous streams of precursor vapor to the reaction chamber, while Atomic Layer Deposition (ALD), pulsed CVD and hybrids thereof may call for continuous streams or pulsed supply to the reaction chamber, depending on the desired configuration, including time-divided and spaced-divided pulsed processes. Vapor phase precursor from such solid substances can also be useful for other types of chemical reactions for the semiconductor industry (e.g., etching, doping, etc.) and for a variety of other industries.

SUMMARY

One object of the disclosed embodiments is to provide a large capacity semiconductor processing system capable of locating a precursor vessel in a remote location from a reaction chamber in the process zone and of feeding a single reaction chamber.

In one embodiment, the system may include a precursor source vessel configured to contain a precursor. The precursor may be in solid phase or liquid phase at ambient pressure and temperature are used. The system may also include a first buffer volume disposed in a subfab zone, which is located outside of clean room. The precursor source vessel is configured to supply the vaporized precursor to the first buffer volume. The system may also include a second buffer volume located in a processing zone, which is located in the clean room and separated from the subfab zone. The first buffer volume configured to convey the vaporized precursor to the second buffer volume. The system may also include a reaction chamber located in the processing zone, the second buffer volume configured to convey the vaporized precursor to the reaction chamber. The system may further include a pressure transducer configured to measure the pressure in the first buffer volume and a controller controlling operation of at least one of the at least one vessel inlet control valve and the one or more vessel outlet control valves based at least on feedback of measured pressure in the first buffer volume. The controller is configured to fill the first buffer volume when the pressure in the first buffer volume falls below a predetermined value.

Another object of one or more aspects of the disclosed embodiments is to provide a large capacity semiconductor processing system capable of locating a precursor vessel in a remote location from a reaction chamber in the process zone and of feeding a plurality of reaction chamber.

In one embodiment, the system may include a precursor source vessel configured to contain a precursor. The precursor may be in solid phase or liquid phase at ambient pressure and temperature are used. The system may also include a first buffer volume disposed in a subfab zone, which is located outside of clean room. The precursor source vessel is configured to supply the vaporized precursor to the first buffer volume. The system may also include a second buffer volume located in a processing zone, which is located in the clean room and separated from the subfab zone. The first buffer volume configured to convey the vaporized precursor to the second buffer volume. The system may also include a reaction chamber located in the processing zone, the second buffer volume configured to convey the vaporized precursor to each reaction chamber. The system may further include a pressure transducer configured to measure the pressure in the first buffer volume and a controller controlling operation of at least one of the at least one vessel inlet control valve and the one or more vessel outlet control valves based at least on feedback of measured pressure in the first buffer volume. The controller is configured to fill the first buffer volume when the pressure in the first buffer volume falls below a predetermined value.

Yet another object of one or more aspects of the disclosed embodiments is to provide a method for delivering large capacity vaporized precursor to a remotely located reaction chamber in process zone.

In one embodiment, the method may include vaporizing a precursor disposed in a precursor source vessel. The method may also include supplying the vaporized precursor to a first buffer volume located in a subfab zone. The method may also include conveying the vaporized precursor to a second buffer volume located in a processing zone separate from the subfab zone and conveying the vaporized precursor to the reaction chamber in the process zone. The method may further include controlling operation of at least one vessel inlet control valve and at least one vessel outlet control valves based at least on feedback of measured pressure in the first buffer volume. Furthermore, the method may also include delivering vaporized precursor to a reaction chamber, for example, by entraining the vaporized precursor with a carrier gas.

BRIEF DESCRIPTION OF THE DRAWINGS

The foregoing and other objectives and advantages will appear from the description to follow. In the description reference is made to the accompanying drawing, which forms a part hereof, and in which is shown by way of illustration specific embodiments in which the disclosed embodiments may be practiced. These embodiments will be described in sufficient detail to enable those skilled in the art to practice the disclosed embodiments, and it is to be understood that other embodiment may be utilized and the structural changes may be made without departing from the scope of the disclosed embodiments. The accompanying drawing, therefore, is submitted merely as showing the preferred exemplification of the disclosed embodiments. Accordingly, the following detail description is not to be taken in a limiting sense, and the scope of the disclosed embodiments is best defined by the appended claims.

DETAILED DESCRIPTION

A delivery system designed to deliver precursor to multiple process chambers can comprise a large capacity solid or liquid precursor source, which uses bulky, individual precursor vessel enclosures dedicated to each process chamber (also referred to as a reaction chamber). By providing a remote evaporation or sublimation assembly, a footprint of the processing system can be reduced. However, due to a long distance between the remote source and the process chamber, a large pressure drop can occur between the source vessel and the process chamber, limiting delivery amount (flow) and extending exposure time. Some implementations can include a buffer volume located in the remote system enclosure, however this does not address pressure and flow loss due to the long distance between the remote system and the process chambers. If a carrier gas is used to entrain or carry the vaporized precursor to the reaction chamber (which is typical for low volatility precursors) an additional, high-temperature compatible concentration measurement and/or control system is provided to ensure consistent delivery to each process chamber.

Hereafter, an apparatus and a method of the disclosed embodiments will be described in detail by way of preferable embodiment shown in the attached drawings. Unless defined otherwise, all technical and scientific terms used herein have the same meaning as is commonly understood by one skill in the art.

In the following detailed description of the disclosed embodiments, numerous specific details are set forth in order to provide a thorough understanding of the disclosed embodiments. However, it will be obvious to one with ordinary skill in the art that the disclosed embodiments may be practiced without these specific details. In other instances, well known methods, procedures, components, and mechanism have not been described in detail as not to unnecessarily obscure aspects of the disclosed embodiments.

Figure 1:
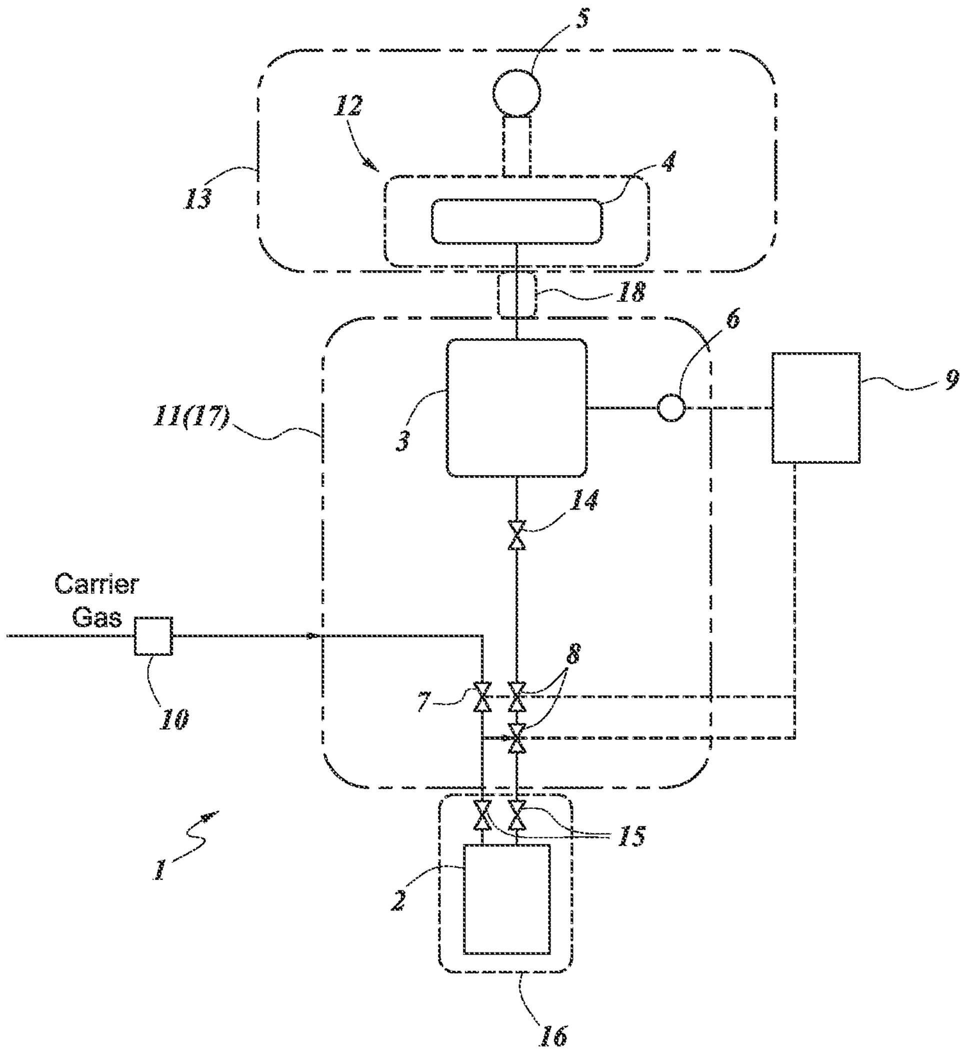
FIG. 1 is a schematic diagram of a semiconductor processing device including a precursor vessel source and a reactor chamber, with a pressure transducer and control system provided to control the flow in a first buffer volume, according to one embodiment.

FIG. 1 is a schematic system diagram of a semiconductor processing system 1, according to one embodiment. The semiconductor processing system 1 can comprise a precursor source vessel 2 configured to contain a precursor chemical, e.g., a solid or liquid precursor. The precursor source vessel 2 is disposed in a vessel temperature zone 16 to be maintained within a first temperature range, which can cause sublimation of solid precursor source particles into vaporized precursor or evaporation of a liquid precursor source into the vaporized precursor. The precursor source vessel 2 can be configured to be in fluid communication with a pressure flow controller (PIT) 10 through at least one vessel inlet control valve 7 to receive a carrier gas. The PFC 10 can be configured to maintain carrier gas pressure constant based on a ratio of a precursor vapor pressure to a carrier control pressure. The PFC 10 can comprise a pressure controller for the carrier gas and can have a controllable orifice, with a pressure gauge and control element that controls the pressure of the carrier gas, and monitors both pressure and flow rate. The use of a PFC allows the user to control concentration and a ratio of carrier to precursor exiting the precursor source vessel 2 without relying on timing, etc. The use of a PFC allows for the control of concentration of precursor coming out of the source vessel, a ratio of carrier to precursor without relying on timing, etc.

In addition, a closed loop control process to open the inlet and outlet of valve, based on a measured pressure of the first buffer volume 3 or the second buffer volume 4 by the pressure transducer 6 can be utilized. For example, a set point for the first buffer volume 3 or the second buffer volume 4 is set and during an operation that delivers precursor to the platform hub 12, when the pressure falls below the set point, the vessel outlet control valves 8 is triggered in closed loop manner to continuously feed the first buffer volume 3.

Figure 3:
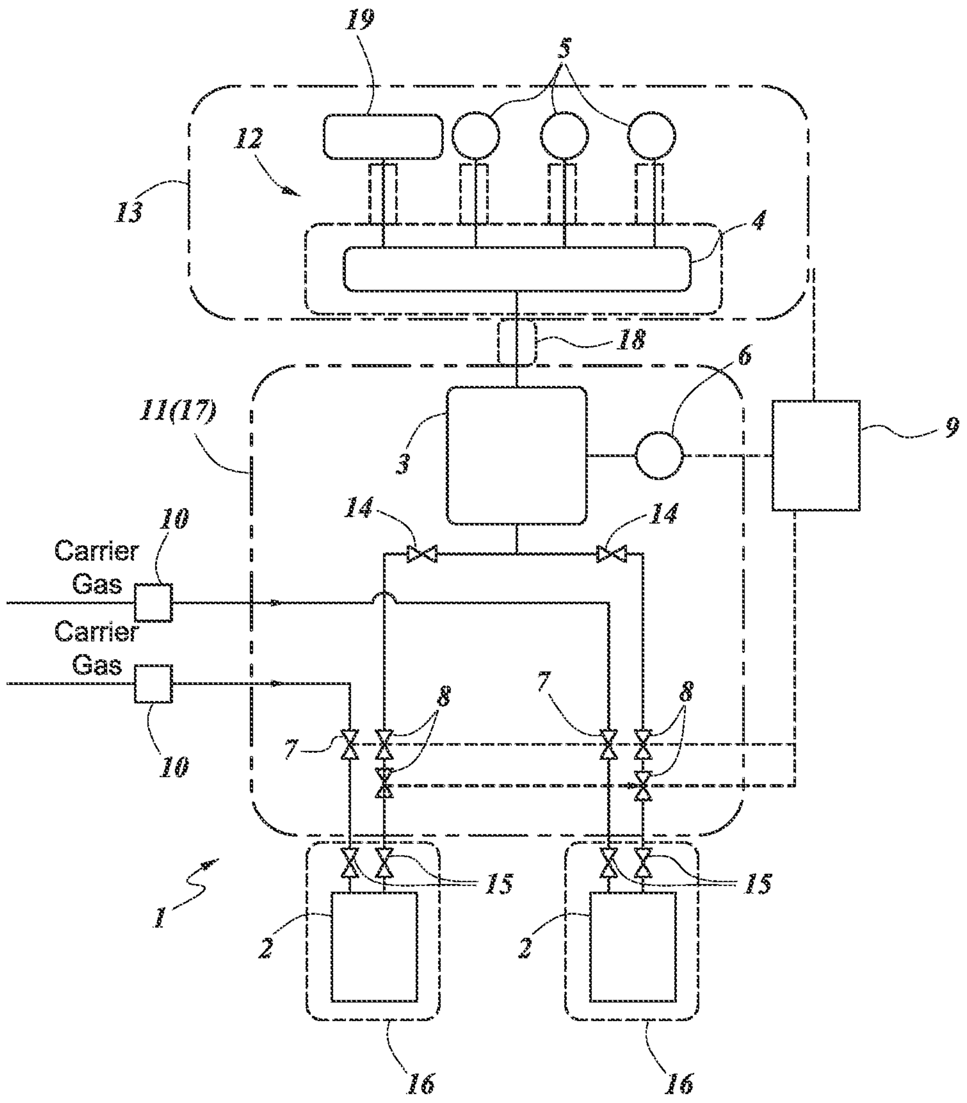
FIG. 3 is a schematic diagram of a semiconductor processing device including a plurality of precursor vessel sources and a plurality of reactor chambers, with a pressure transducer and control system provided to control the flow in a first buffer volume.

A carrier gas can be supplied to the precursor source vessel 2 to entrain with the vaporized precursor so as to carry the precursor vapor to the reaction chamber 5. The carrier gas can be any suitable inactive gas, such as nitrogen gas or argon gas. The at least one carrier gas supply valve 7 can be provided along a gas supply line to regulate the flow of the carrier gas. In the embodiment of FIG. 1, the system 1 can include a single source vessel 2. As shown in FIG. 3, however, the semiconductor processing system 1 can comprises a plurality of precursor source vessels in some embodiments. In some embodiments, each of the precursor source vessels 2 may hold the same precursor and may have an independent carrier gas source so as to enable seamless operation by switching from a depleted vessel to a filled vessel such that maintenance can be performed to a vessel that is not in use.

A first buffer volume 3 can be disposed in a subfab zone 11, in which pumps and other utilities are located. In some embodiments, the subfab zone 11 can be physically separate from a processing zone 13 in which the reaction chamber 5 is disposed. For example, in some embodiments, the subfab zone 11 can be disposed underneath the floor in which the processing zone 13 (e.g., a cleanroom) is disposed. In other embodiments, however, the subfab zone 11 can be located at any other suitable location that is physically separate from the processing zone 13. For example, the subfab zone 11 can be disposed in a cabinet temperature zone 17 to be maintained within a second temperature range different from the first temperature range. In other embodiments, the cabinet temperature zone 17 can be maintained within a second temperature range that partially or completely overlaps with the first temperature range. Generally, the precursor source vessel 2 in the vessel temperature zone 16 is maintained at a temperature that is less than a temperature of the subfab zone 11 and the processing zone 13, and the temperature at the subfab zone 11 is less than a temperature of processing zone 13. The vaporized precursor can be provided to the first buffer volume 3 from the precursor source vessel 2. A second buffer volume 4 can be disposed in the processing zone 13 separate from the subfab zone 11 and that is located in a ventilated cabinet with radiant, convective or contact heating so that the second buffer volume 4 is heated. An inlet of the first buffer volume 3 can be in fluid communication with the precursor source vessel 2 through one or more vessel outlet control valves 8 and a first buffer inlet valve 14. An outlet of the first buffer volume 3 can be in fluid communication with the second buffer volume 4 to convey the vaporized precursor from the first buffer volume 3 to the second buffer volume 4. The first buffer volume 3 can be connected to the second buffer 4 by a heated pipe 18.

The semiconductor processing system 1 can comprise a reaction chamber 5 located in the processing zone 13. The second buffer volume 4 can be disposed in close proximity to the reaction chamber 5 and can be configured to convey the vaporized precursor to the reaction chamber 5, so that pressure drop from remote precursor source can be reduced. The second buffer volume 4 can be on top of the platform hub 12 and can feed to the reaction chamber 5. The platform hub 12 is ventilated cabinet, comprising connection points. The first and second buffer volumes can be sized to store five to ten times a precursor load used for one (1) cycle for the reaction chamber 5. The first and second buffer volumes 3, 4 can act as a fluid capacitor of sorts that builds up pressure within each buffer volume as gas is accumulated (similar to how a capacitor builds up charge). A controller 9 send instructions to the valves to supply precursor to the buffer volume to build up pressure to a desired value for deposition. In the embodiment of FIG. 1, the system 1 can include a single reaction chamber 5 in some embodiments. In other embodiments, as shown in FIG. 3, the semiconductor processing system 1 can comprise a plurality of reaction chambers 5 and a third buffer volume 19 can be connected to the platform hub 12.

The semiconductor processing system 1 can further comprise a pressure transducer 6 configured to measure the pressure in the first buffer volume 3 and a controller 9 configured to control the operation of at least one of the vessel inlet control valve(s) 7 and the vessel outlet control valve(s) 8. During operation, the pressure transducer 6 can monitor the pressure of the first buffer volume 3 and transmit the measured pressures to the controller 9. Based on the measured pressure, the controller 9 can send instructions to the vessel inlet control valve 7 and/or the vessel outlet control valve 8 to open or close the valves, in embodiments in which the vessel inlet control valve 7 and the vessel outlet control valve 8 comprise a binary on/off valve. In embodiments in which the valves 7 and/or 8 are adjustable valves, the controller 9 can send instructions to the valves 7 and/or 8 to continuously adjust a fluid conductance of the valves 7 and/or 8. The controller 9 can send instructions to fill the first buffer volume 3 when the pressure in the first buffer volume 3 falls below a predetermined pressure value.

For example, in various embodiments, a closed loop control system can control the opening and/or closing of the valves 7 and/or 8 (e.g., valve timing, frequency, etc.) based on feedback of the pressure of the first buffer volume 3 measured by the pressure transducer 8. In various embodiments, for example, a proportional-integral-derivative (PID) controller can be used to control the operation of the vessel inlet control valve 7 and/or the vessel outlet control valve 8. In some embodiments, the controller 9 can determine the time duration in which the vessel outlet control valve 8 is to open in order to reach or maintain a desired pressure for the first buffer volume 3 that is provided to the PID or other controller.

In various embodiments, piping, valves, and filters used in the system can have a large flow coefficient (Cv) to reduce or minimize pressure drop. For example, ½" or ⅜" diameter piping and ⅜" feeding modules can be used.

Figure 2:
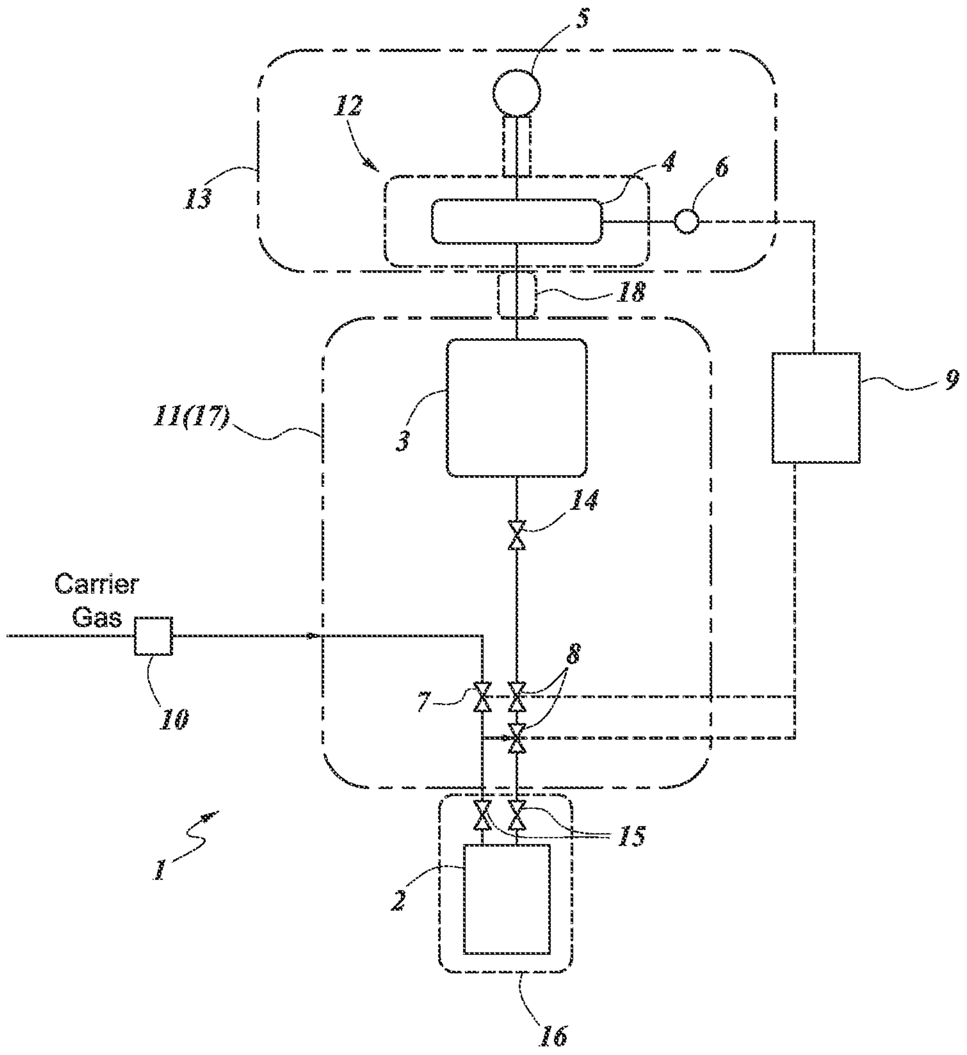
FIG. 2 is a schematic diagram of a semiconductor processing device including a precursor vessel source and a reactor chamber, with a pressure transducer and control system provided to control the flow in a second buffer volume, according to one embodiment.

In FIG. 1, the system 1 includes a closed-loop control system in which the controller 9 monitors and/or controls the pressure of the first buffer volume 3 within the subfab zone 11. As shown in FIG. 2, in some embodiments, the pressure transducer 6 can additionally or alternatively be configured to measure the pressure in the second buffer volume 4, and a controller 9 can be configured to control the operation of at least one of the vessel inlet control valve(s) 7 and the vessel outlet control valve(s) 8 based at least on feedback of measured pressure in the second buffer volume 4. The controller 9 can send instruction to fill the second buffer volume 4 when the pressure in the second buffer volume 4 falls below a predetermined value. It should be appreciated that in still other embodiments, pressure transducers can be used to monitor the respective pressure(s) of both the first and second buffer volumes 3, 4. In such embodiments, one or more controllers can be configured to provide feedback control for both buffer volumes 3, 4.

Figure 4:
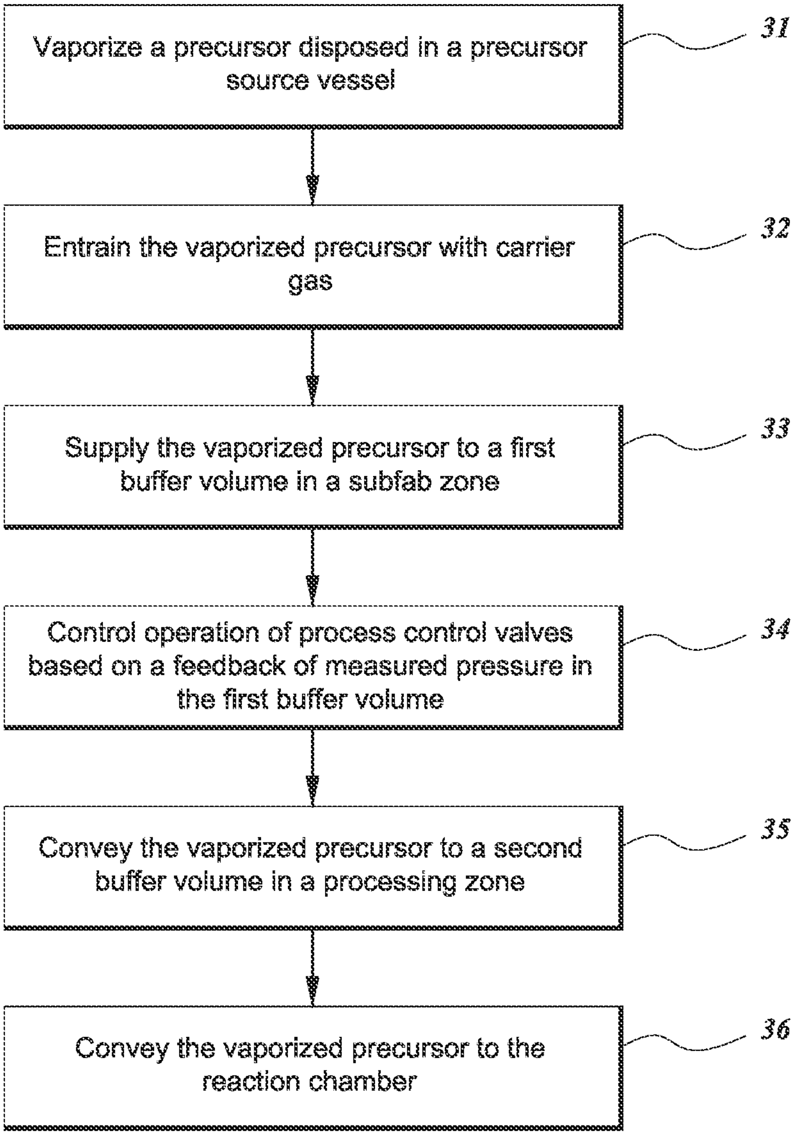
FIG. 4 is a flowchart illustrating a semiconductor processing method, according to various embodiments.

FIG. 4 is a flowchart illustrating a method for delivering vaporized precursor to a remotely located reaction chamber 5 in the process zone 13, according to various embodiments. The method begins in a block 31, in which a solid or liquid precursor disposed in a precursor source vessel 2 is vaporized through a sublimation or evaporation process, for example, heated to a temperature above the sublimation or evaporation temperature of the precursor source material.

In a block 32, the inactive carrier gas is provided to the precursor source vessel 2 to entrain the vaporized precursor with the carrier gas for delivery to the reaction chamber 5. Any suitable inactive carrier gas can be used, such as argon (Ar) gas or nitrogen ($N_2$) gas. The flow of the carrier gas flowing into the precursor source vessel 2 can be measured by a flow controller, such as a pressure controller with flow monitor (PFC) 10 can be used.

In a block 33, the vaporized precursor can be supplied from the precursor source vessel 2 in the vessel temperature zone 16 to a first buffer volume 3 in a subfab zone 11. As explained above, the subfab zone 11 can be physically and thermally separated from the process zone 13, which can comprise a cleanroom. Moving to a block 34, a pressure in the first buffer volume 3 can be measure by the pressure transducer 6. Feedback control methods can be used to monitor the pressure and to fill the first buffer volume 3 when the pressure in the first buffer volume 3 falls below a predetermined value by operating at least one of the vessel inlet control valve(s) 7 and the vessel outlet control valve(s) 8.

In a block 35, the vaporized precursor can be conveyed to the second buffer volume 4 in the processing zone 13. The pressure transducer 6 can be disposed in the second buffer volume 4 and an operation of block 34 can be implemented after the block 35 to control the pressure of the second buffer volume 34. In a block 36, the vaporized precursor can be conveyed to the reaction chamber 5 in the processing zone 13. In some embodiments, as shown in FIG. 3, the vaporized precursor can be delivered to multiple different reaction chambers 5 by way of corresponding multiple heated pipes.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted fairly based on the language employed in the claims and not limited to the examples described in the present specification or during the prosecution of the application, which examples are to be construed as non-exclusive.

What is claimed is:

1. A semiconductor processing system, comprising:

a precursor source vessel configured to contain a precursor, wherein the precursor source vessel is configured to be in fluid communication with a pressure flow controller (PFC) through at least one vessel inlet control valve to provide a carrier gas to the precursor source vessel, and wherein the PFC is configured to maintain carrier gas pressure constant based on a ratio of precursor vapor pressure to carrier control pressure;

a first buffer volume disposed in a subfab zone, the precursor source vessel configured to supply the vaporized precursor to the first buffer volume;

a second buffer volume located in a processing zone separate from the subfab zone, the first buffer volume configured to convey the vaporized precursor to the second buffer volume; and a reaction chamber located in the processing zone, the second buffer volume configured to convey the vaporized precursor to the reaction chamber.

2. The semiconductor processing system according to claim 1, further comprising a plurality of precursor source vessels.

3. The semiconductor processing system according to claim 1, wherein an inlet of the first buffer volume is in fluid communication with the precursor source vessel through one or more vessel outlet control valves, and an outlet of the first buffer volume is in fluid communication with the second buffer volume, and wherein the second buffer volume is configured to distribute the vaporized precursor to the reaction chamber.

4. The semiconductor processing system according to claim 1, further comprising:

a pressure transducer configured to measure the pressure in the first buffer volume, and a controller configured to control operation of at least one of the at least one vessel inlet control valve and one or more vessel outlet control valves based at least on feedback of measured pressure in the first buffer volume.

5. The semiconductor processing system according to claim 4, wherein the controller is configured to fill the first buffer volume when the pressure in the first buffer volume falls below a predetermined value.

6. The semiconductor processing system according to claim 1, wherein the precursor source vessel is disposed in a vessel temperature zone to be maintained at a first temperature and the subfab zone is disposed in a cabinet temperature zone to be maintained at a second temperature.

7. The semiconductor processing system according to claim 1, wherein the second buffer volume is heated with radiant, convective or contact heating.

8. The semiconductor processing system according to claim 1, wherein the first and second buffer volumes are sized to store five to ten times a precursor load used for one (1) cycle for the reaction chamber.

9. The semiconductor processing system according to claim 6, wherein the first temperature is lower than the second temperature.

10. The semiconductor processing system according to claim 1, wherein the first buffer volume is connected to the second buffer volume by a heated pipe.

11. A semiconductor processing system comprising:

a precursor source vessel configured to contain a vaporized precursor, wherein the precursor source vessel is configured to be in fluid communication with a pressure flow controller (PFC) through at least one vessel inlet control valve to provide a carrier gas to the precursor source vessel, and wherein the PFC is configured to maintain carrier gas pressure constant based on a ratio of precursor vapor pressure to carrier control pressure;

a first buffer volume configured to receive the vaporized precursor from the precursor source vessel;

a second buffer volume configured to receive the vaporized precursor from the first buffer volume; and a plurality of reaction chambers located in fluid communication with the second buffer volume.

12. The semiconductor processing system according to claim 11, wherein an inlet of the first buffer volume is in fluid communication with the precursor source vessel through one or more vessel outlet control valves, and an outlet of the first buffer volume is in fluid communication with the second buffer volume, and wherein the vaporized precursor delivered to the second buffer volume is distributed to each reaction chamber through a platform hub.

13. The semiconductor processing system according to claim 12, wherein the first and second buffer volumes are sized to store 5-10 times a precursor load used for one (1) cycle for all the plurality of reaction chambers on the platform hub running simultaneously.

14. The semiconductor processing system according to claim 13, wherein a third buffer volume is connected to the platform hub.

15. The semiconductor processing system according to claim 12, further comprising a plurality of precursor source vessels, wherein each precursor source vessel is configured to be in fluid communication with respective pressure flow controllers (PFC) through at least one vessel inlet control valve of each precursor source vessel to provide a carrier gas to the precursor source vessel.

16. The semiconductor processing system according to claim 15, further comprising:

a pressure transducer configured to measure the pressure in the first buffer volume, and a controller controlling operation of the at least one vessel inlet control valve of each precursor source vessel and one or more vessel outlet control valves of each precursor source vessel based at least on feedback of measured pressure in the first buffer volume.

17. The semiconductor processing system according to claim 11, wherein the first buffer volume is disposed in a subfab zone at a first temperature and the second buffer volume is located in a processing zone physically separate from the subfab zone and at a second temperature.

18. The semiconductor processing system according to claim 15, further comprising:

a pressure transducer configured to measure the pressure in the second buffer volume, and a controller controlling operation of at least one of the at least one vessel inlet control valve and the one or more vessel outlet control valves based at least on feedback of measured pressure in the first buffer volume, wherein the controller is configured to fill the second buffer volume when the pressure in the first buffer volume falls below a predetermined value.

19. A semiconductor processing system comprising:

a precursor source vessel configured to contain a vaporized precursor, wherein the precursor source vessel is configured to be in fluid communication with a pressure flow controller (PFC) through at least one vessel inlet control valve to provide a carrier gas to the precursor source vessel, and wherein the PFC is configured to maintain carrier gas pressure constant based on a ratio of precursor vapor pressure to carrier control pressure;

a first buffer volume disposed in a subfab zone at a first temperature and configured to receive the vaporized precursor from the precursor source vessel;

a second buffer volume disposed in a processing zone at a second temperature and configured to receive the vaporized precursor from the first buffer volume, wherein the second temperature is greater than the first temperature; and a plurality of reaction chambers located in fluid communication with the second buffer volume.

* * * * *